United States Patent [19]

Yu

[11] Patent Number: 5,656,545
[45] Date of Patent: Aug. 12, 1997

[54] ELIMINATION OF TUNGSTEN DIMPLE FOR STACKED CONTACT OR VIA APPLICATION

[75] Inventor: Chen-Hua Yu, Keelung, Taiwan

[73] Assignee: Taiwan Semiconductor Manufacturing Company, Ltd, Hsin-Chu, Taiwan

[21] Appl. No.: 606,953

[22] Filed: Feb. 26, 1996

[51] Int. Cl.⁶ .................................. H01L 21/28
[52] U.S. Cl. .................. 438/627; 438/628; 438/629; 438/643
[58] Field of Search .................... 437/190, 192, 437/246

[56] References Cited

U.S. PATENT DOCUMENTS

| | | | |
|---|---|---|---|
| 5,231,051 | 7/1993 | Boldi et al. | 437/192 |
| 5,286,675 | 2/1994 | Chen et al. | 437/192 |
| 5,332,691 | 7/1994 | Kinoshita et al. | 437/192 |
| 5,422,310 | 6/1995 | Ito | 437/192 |
| 5,489,552 | 2/1996 | Mechat et al. | 437/192 |
| 5,552,340 | 9/1996 | Lee et al. | 437/200 |

FOREIGN PATENT DOCUMENTS

| | | |
|---|---|---|
| 6-045326 | 2/1994 | Japan . |
| 6-204346 | 7/1994 | Japan . |

*Primary Examiner*—John Niebling
*Assistant Examiner*—Thomas G. Bilodeau
*Attorney, Agent, or Firm*—George O. Saile

[57] ABSTRACT

A method for forming planarized tungsten plugs, for small diameter contact holes, using a RIE etchback process, has been developed. An objective of reducing a seam, inherent when filling holes with chemically vapor deposited materials, was realized by use of a minimum thickness of tungsten, just sufficient to fill the narrow contact hole. The attainment of the reduced tungsten seam was also aided via use of a low temperature deposition, as well as a slow deposition rate.

22 Claims, 5 Drawing Sheets

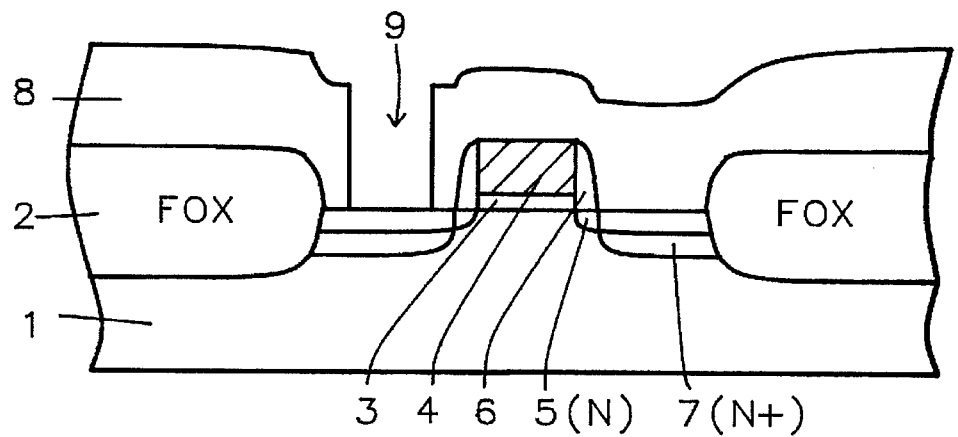
FIG. 1
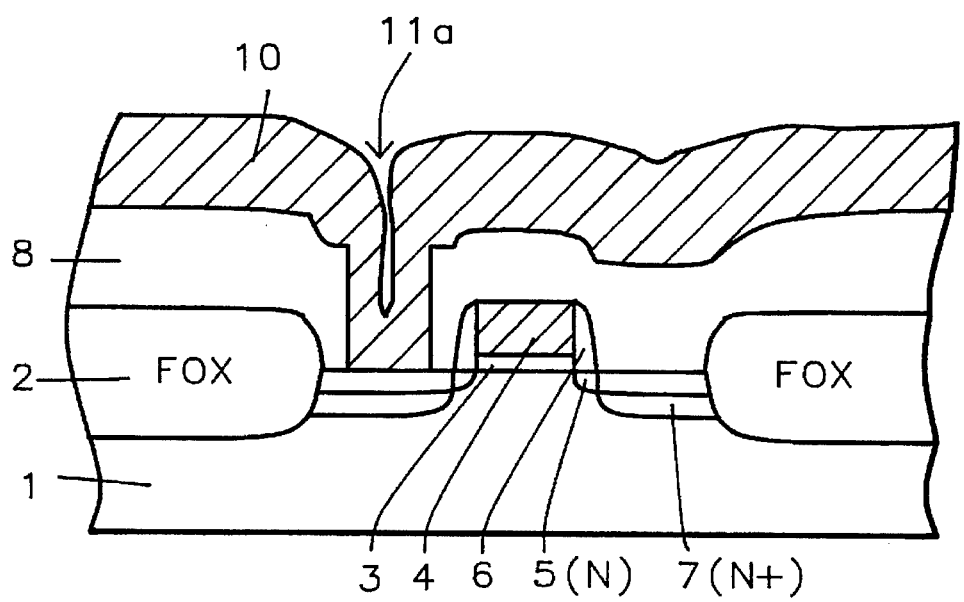
FIG. 2 - Prior Art

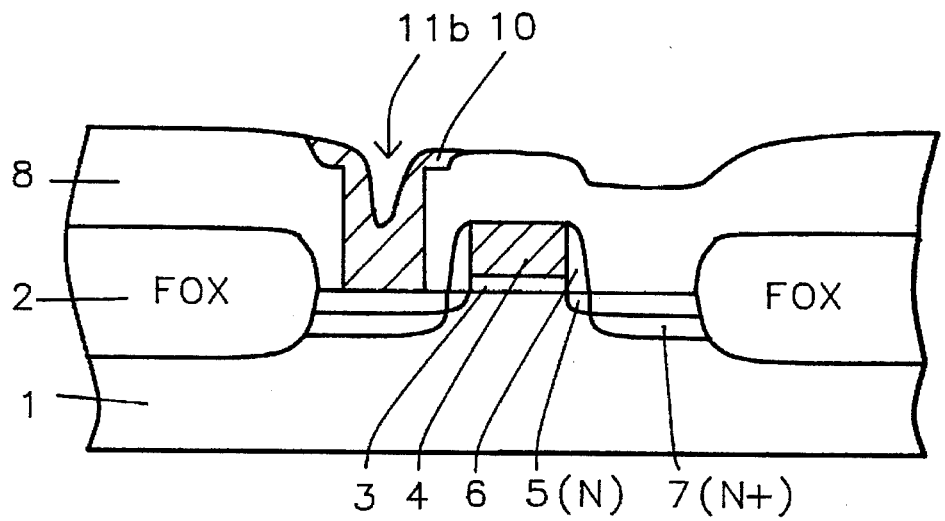
FIG. 3 – Prior Art
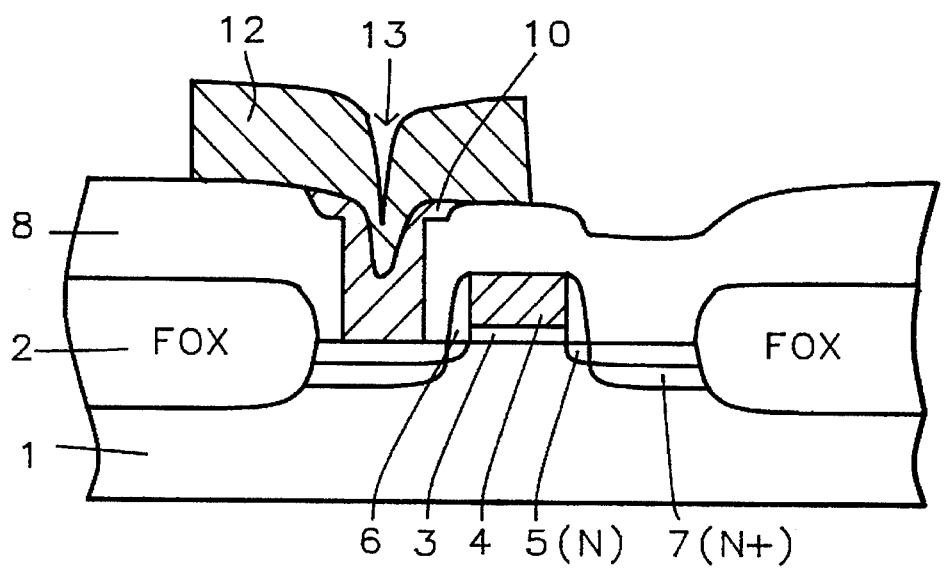
FIG. 4 – Prior Art

5,656,545

ELIMINATION OF TUNGSTEN DIMPLE FOR STACKED CONTACT OR VIA APPLICATION

BACKGROUND OF THE INVENTION (1) Field of the Invention

This invention relates to methods used to fabricate semiconductor devices, and more specifically to a process for creating tungsten filled contact, or via holes.

(2) Description of Prior Art

The objectives of the semiconductor industry are to continually improve the performance of silicon devices, while maintaining or decreasing the cost of these devices. The ability to manufacture silicon chips, exhibiting sub-micron features, have in part, allowed the performance and cost objectives to be realized. For example silicon devices, fabricated with specific sub-micron features, result in larger decreases in performance degrading resistances and capacitances, then counterparts fabricated using less aggressive designs. In addition the ability to produce smaller silicon chips, due to the use of smaller features, allows more chips to be produced from a specific size starting silicon substrate. Since the processing cost for the silicon substrate remains the same, the cost of an individual silicon chip is reduced. The use of sub-micron features, or the trend to micro-miniaturization, has been achieved as a result of advances or development of several semiconductor fabrication disciplines, such as photolithography, and dry etching. The use of more sophisticated exposure cameras, as well as the development of more sensitive photoresist materials, have allowed sub-micron images to be routinely produced in photoresist layers. In addition the development of selective, anisotropic, dry etching processes, have allowed these sub-micron images in photoresist layers, to be successfully transferred to underlying materials, used for the fabrication of advanced silicon devices.

However with the trend to micro-miniaturization, difficulties are encountered with specific semiconductor fabrication sequences, that had not been present for counterparts fabricated using larger device features. For example via or contact holes, used to interconnect two levels of metallization, or used to connect an overlying metallization to an underlying silicon device region, become more difficult to fill with a conductive material, such as aluminum, using metal deposition processes, such as evaporation or sputtering. Chemically vapor deposited processes supply superior fill characteristics, however it is difficult to chemically vapor deposit aluminum. In addition the use of aluminum, to fill via or contact holes, is limited due to the combination of increased current carrying demands, arising as a result of micro-miniaturization, and the poor current carrying characteristics of aluminum. Therefore the industry has preferred to use tungsten as a fill material for small diameter contact holes, taking advantage of the improved conformality properties of the chemically vapor deposited tungsten, and the enhanced current carrying characteristics of tungsten.

One specific shortcoming of the use of chemically vapor deposited, metal fills, is the seam or dimple in the fill. The metal fill proceeds by the mechanism of the depositing metal film, coating the sides of the contact hole. At a specific point, where the coated sides converge, a seam or dimple can evolve. Subsequent processing, such as dry etching used to remove unwanted metal from areas outside the contact hole, can aggravate the seam and produce a metal void, in the center of the contact or via hole. The void now offers a severe topology for subsequent interconnect metallizations, which can sometimes result in yield or reliability problems.

Therefore the semiconductor industry has offered many solutions for the seam or dimple phenomena, encountered when using chemically vapor deposited metal films, specifically tungsten, to fill small diameter contact holes. One such solution, used to alleviate the dimple or seam phenomena for tungsten fills, has been offered by Ito, in U.S. Pat. No. 5,422,310. Ito suggests using a two stage dry etching process to remove unwanted tungsten, from areas outside the tungsten filled contact hole. The second stage of the dry etching procedure, performed at different conditions then the previous etching stage, remove tungsten residuals without significant attack of the tungsten in the contact hole, thus not aggravating the seam. The solution offered in this invention concentrates on a specific set of tungsten deposition conditions that allow for improved tungsten conformality, in turn allowing the fill to be successfully completed with a minimum of deposited metal. This results in a shorter etch back sequence, thus less exposure of tungsten seam to the etch back process.

SUMMARY OF THE INVENTION

It is an object of this invention to fill small diameter contact via holes with chemically vapor deposited tungsten, and planarize to form a tungsten plug without the use of chemical mechanical polishing.

It is another object of this invention to improve the step coverage, or conformality of the tungsten deposition, by optimization of the deposition conditions.

It is still another object of this invention to use the minimum tungsten thickness needed for complete filling of the contact or via hole.

It is still yet another object of this invention to minimize the time of the etch back process, in order to decrease exposure of the tungsten seam to this process, and to limit the recess of the tungsten fill in the contact hole.

In accordance with the present invention a method is described for fabricating small diameter, tungsten filled, contact holes, in which the effects of a seam in the tungsten fill is minimized by use of specific tungsten deposition and etch back conditions. A small diameter contact hole, is opened in a dielectric layer, to an active device region in a semiconductor substrate. A layer of titanium, to be used for adhesion and contact purposes, and a layer of titanium nitride, to be used as a barrier to protect underlying materials from attack from subsequent process reactants, are deposited. A slow depositing, conformal deposition, of a thin layer of chemically vapor deposited tungsten is performed, to fill the small diameter contact hole. A minimum of etch back of the unwanted tungsten, on the field, is performed, to create the tungsten plug in the small diameter contact hole, and to expose titanium nitride on non-contact hole regions, without excessive recessing of the tungsten plug. Another selective etch back procedure is then employed to remove titanium nitride and titanium from non-contact hole regions, which completes the planarazation of the tungsten plus. Interconnect metallization and patterning are performed to complete the process.

BRIEF DESCRIPTION OF THE DRAWINGS

The object and other advantages of this invention are best described in the preferred embodiment with reference to the attached drawings that include:

FIG. 1, which schematically, in cross-sectional style, shows a silicon device, at a stage prior to tungsten contact hole filling.

FIGS. 2–4, which schematically, in cross-sectional style, show prior art, in which seams in a tungsten fill, resulted in inadequate, interconnect metallization coverage.

DESCRIPTION OF THE PREFERRED EMBODIMENTS

Figure 5:
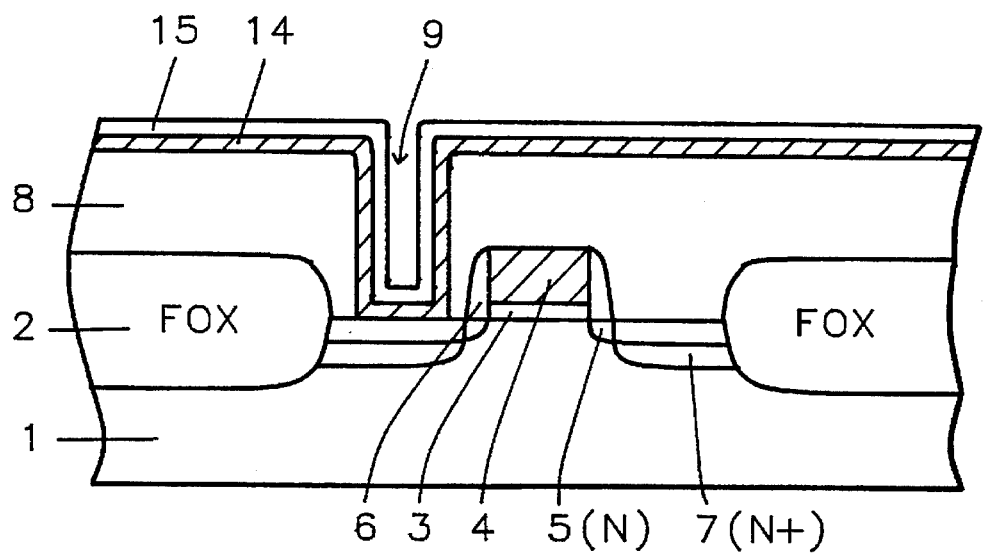
FIGS. 5–9, which schematically, in cross-sectional style, show specific fabrication stages used to produce tungsten fills with a minimum of seams, thus allowing adequate interconnect metallization coverage to be achieved.

The method for creating small diameter, tungsten filled, contact holes, with little or no tungsten seam, will now be described. This invention can be used as part of metal oxide semiconductor field effect transistors, (MOSFET), devices, that are currently being manufactured in industry, therefore only the specific areas, unique to understanding this invention, will be covered in detail.

FIG. 1, schematically shows an N channel, (NFET), device, that this invention of tungsten filling, of small diameter contact holes, can be applied to. A P type, single crystalline silicon substrate, 1, with a <100> crystallographic orientation, is used. Thick field oxide regions, (FOX), 2, are formed for purposes of device isolation. The FOX regions are produced by patterning a composite layer of silicon nitride on silicon dioxide, using conventional photolithographic and reactive ion etching, (RIE), processes. After photoresist removal, using oxygen plasma ashing, followed by wet cleans, the composite insulator pattern is used as an oxidation mask, and FOX region, 2, is created in non-masked areas, via thermal oxidation in an oxygen-steam ambient, to a thickness between about 4000 to 6000 Angstroms. After removal of the composite insulator pattern, using hot phosphoric acid for the silicon nitride layer, and a buffered hydrofluoric acid solution for the underlying silicon dioxide layer, a thin silicon dioxide, gate insulator, 3, is grown at a temperature between about 800° to 1000° C., to a thickness between about 50 to 300 Angstroms, in an oxygen-steam ambient. A polysilicon layer is next deposited using low pressure chemical vapor deposition, (LPCVD), processing, at a temperature between about 500° to 700° C., to a thickness between about 2000 to 4000 Angstroms. The polysilicon can be deposited intrinsically and doped via ion implantation of phosphorous or arsenic, at an energy between about 50 to 100 Kev., at a dose between about 1E15 to 1E16 atoms/cm$^2$. Another alternative is to deposit the polysilicon layer using insitu doping procedures via incorporation of either phosphine or arsine to a silane ambient. Conventional photolithographic and RIE processing, using Cl$_2$ as an etchant, are used to create polysilicon gate structure, 4, shown schematically in FIG. 1.

After photoresist removal, via oxygen plasma ashing and wet cleans, an N type, lightly doped source and drain region, 5, is created via ion implantation of phosphorous, at an energy between about 30 to 60 Kev., at a dose between about 1E12 to 5E13 atoms/cm$^2$. A silicon oxide layer is next deposited using either LPCVD or plasma enhanced chemical vapor deposition, (PECVD), processes, at a temperature between about 400° to 800° C., using tetraethylorthosilicate as a source, to a thickness between about 1500 to 4000 Angstroms. An anisotropic, selective RIE process, using CHF$_3$ as an etchant, is used to create insulator sidewall spacer, 6, shown in FIG. 1. Another ion implantation procedure, using arsenic at an energy between about 50 to 100 Kev., at a dose between about 1E14 to 5E15 atoms/cm$^2$, is used to create the N+, heavily doped source and drain region, 7.

An insulator layer of silicon oxide, 8, is deposited using either LPCVD, PECVD, or atmospheric pressure chemical vapor deposition, (APCVD), processing, at a temperature between about 300° to 800° C., to a thickness between about 5000 to 10000 Angstroms, and planarized using chemical mechanical polishing procedures. Contact hole, 9, is formed in silicon oxide layer, 8, via use of standard photolithographic and RIE procedures, using CHF$_3$ as an etchant. The trend to micro-miniaturization demands contact holes with diameters in the sub-micron range, therefore the aspect ratio, the ratio of the depth of the contact hole divided by the diameter of the contact hole opening, using aggressive groundrules, can be large and therefore present difficulties when attempting to fill using conventional metal deposition procedures. FIG. 1, schematically shows this structure after photoresist removal, arrived at via oxygen plasma ashing and careful wet cleans.

FIGS. 2–4, will schematically describe prior art, and attempts at filling, and patterning, large aspect ratio, contact holes, using conventional tungsten deposition processes and standard RIE etch back procedures. FIG. 2, shows a large aspect ratio, contact hole, filled with tungsten, 10. The tungsten deposition was performed using LPCVD processing at a temperature between about 300° to 600° C., to a thickness between about 3000 to 8000 Angstroms, using tungsten hexafluoride as a source. The deposition rate for tungsten using these conditions, was about 6000 Angstroms/min., and as a consequence of this high tungsten deposition rate, the resulting, thick tungsten layer, 10, is formed with an undesirable seam or void, 11a, shown schematically in FIG. 2.

The consequence of seam, 11a, in FIG. 2, is realized when a blanket, selective RIE process, is employed to remove unwanted tungsten, from the surface of silicon oxide layer, 8. This RIE procedure, using either SF$_6$ or Cl$_2$ as an etchant, aggravates seam, 11a, during the etch back procedure, and also during an overetch step, used to insure complete removal of unwanted tungsten. The thick tungsten layer, 10, initially used to fill the large aspect ratio contact hole, can result in large uniformity deltas, thus requiring longer etch back cycles, then would have been required if thinner, more uniform tungsten had been used. Seam, 11a, now exposed to long etch back cycles, can evolve into void 11b, shown schematically in FIG. 3. The large void, 11b, does not allow for adequate coverage of an overlying metallization layer, 12, shown in FIG. 4, with severe metal thinning in area, 13, which can result in yield loss due to metal opens, or result in reliability problems due to the increased current densities that will exist for metallization layer, 12, when overlying area, 13.

A process will now be described in which the seam, inherent in chemically vapor deposited metals, when used to fill large aspect ratio, contact holes, is minimized. Referring back to FIG. 1, a large aspect ratio, contact hole, 9, is opened in silicon oxide layer, 8, via anisotropic RIE, using CHF$_3$ as an etchant. The depth of contact hole, 10, equal to the thickness of silicon oxide layer, 8, is between about 5000 to 10000 Angstroms, with a diameter opening between about 0.3 to 0.5 uM, by 0.3 to 0.5 uM. After a buffered hydrofluoric acid treatment, used to remove any native oxide from the surface of source and drain region, 7, a titanium layer, 14, shown in FIG. 5, is deposited using r.f. sputtering, to thickness between about 200 to 500 Angstroms. This layer is used to provide ohmic contact to underlying device regions, and to improve the adhesion of subsequent metallization layers, to underlying silicon oxide surfaces. Next a layer of titanium nitride, 15, is deposited using r.f.

sputtering, to a thickness between about 50 to 1000 Angstroms. Subsequent tungsten deposition, using decomposition of tungsten hexafluoride, can produce by-products that can attack exposed silicon or titanium regions, thus the titanium nitride layer, 15, shown schematically in FIG. 5, is used as a barrier layer, against this possible attack.

Figure 6:
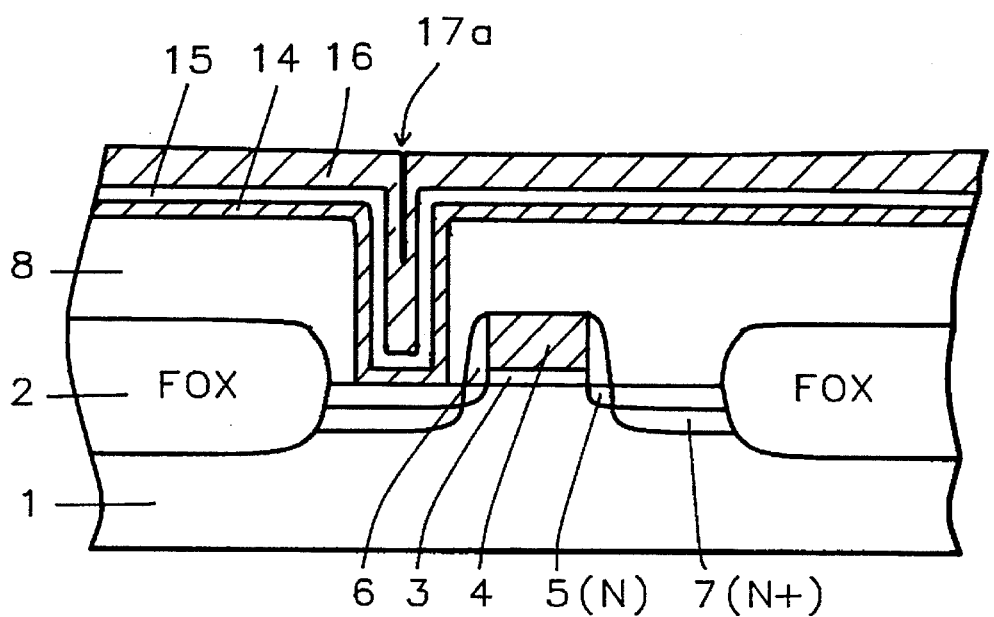
Figure 7:
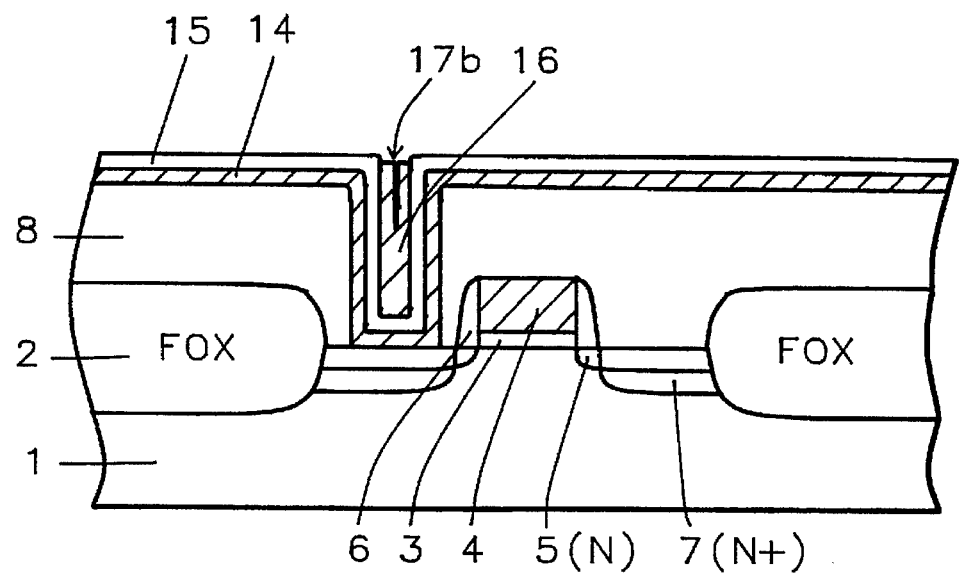

The tungsten fill process is next performed using deposition conditions that will result in superior step coverage, thus enabling the minimum of tungsten thickness to be used to fill the large aspect ratio, contact hole. The deposition of tungsten layer, 16, is again performed using a decomposition of tungsten hexafluoride, LPCVD processing, again at a temperature between about 300° to 600° C., but now with a deposition rate of only about 4000 Angstroms/min., resulting in a thickness between about 3000 to 6000 Angstroms. Therefore the superior step coverage, tungsten fill, achieved via use of the above conditions, basically the reduced deposition rate, allows contact holes as narrow as 0.4 uM, to be adequately filled with as little as 3000 of tungsten. FIG. 6, also schematically indicates that the inherent seam, 17a, in the tungsten fill, is not as large as seam, 11a, previously shown in FIG. 2, produced using thicker, less uniform, tungsten fills. The etch back process, used to remove unwanted tungsten from the top surface of silicon oxide layer, 8, is next carried out via selective, RIE, processing, using $SF_6$ and $Cl_2$, or just $Cl_2$, as an etchant. The result of this etch back process is shown in FIG. 7. The RIE etch back step, includes an overetch, performed to insure complete removal of tungsten, even in areas where non-uniformities may have existed. The amount of overetch, if excessive, can deleteriously effect an exposed seam in the tungsten fill. Therefore it is important to minimize the overetch, therefore protecting the exposed seam, and this is made possible by using a thin, uniform tungsten layer, obtained via use of the tungsten deposition conditions described in this invention. Seam, 17b, is a result of seam 17a, being subjected to the etch back procedures.

Figure 8:
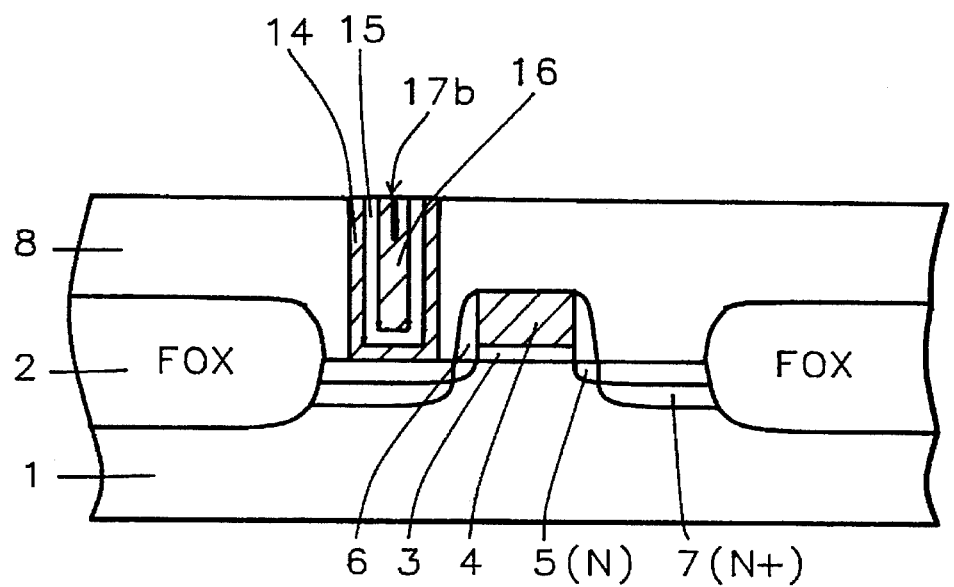

The overetch portion of the RIE etch back process, results in the tungsten fill, or tungsten plug, being recessed to a level approximately equal to the surface of titanium layer, 14. Another RIE process is then performed, using $BCl_3$ and $Cl_2$ as an etchant, to remove titanium nitride layer, 15, as well as titanium layer, 14, while removing tungsten at a much slower rate, resulting in a structure in which the top surface of the tungsten plug, 16, is at the same level as the top surface of silicon oxide layer, 8. FIG. 8, shows the resulting structure, also showing little change to tungsten seam, 17b.

Figure 9:
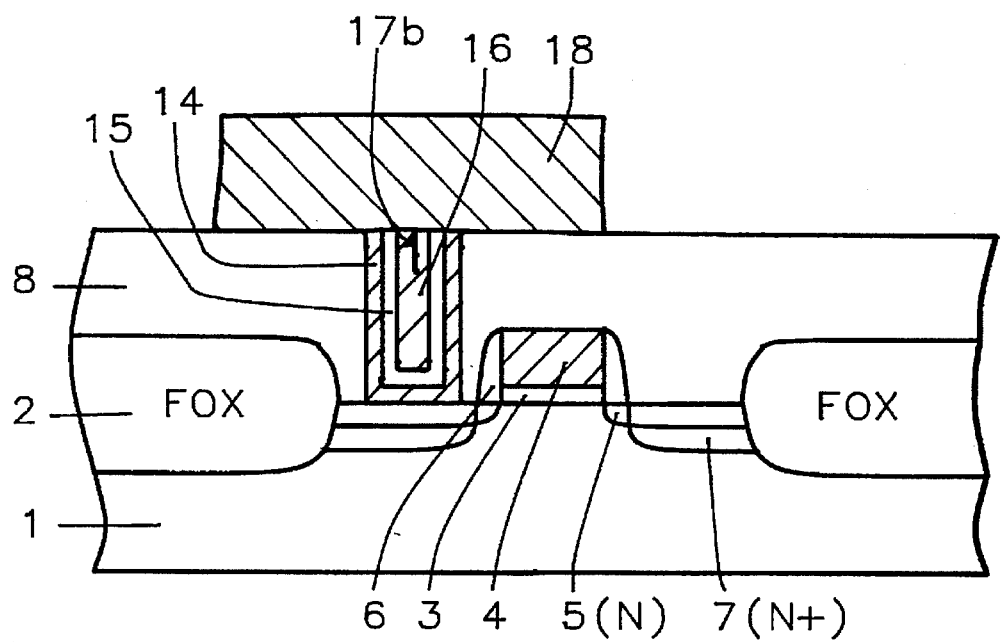

A metallization layer of aluminum, containing between about 0.5 to 2.0% copper, and between about 0.5 to 3.0% silicon, is deposited using r.f. sputtering, to a thickness between about 3000 to 8000 Angstroms. Conventional photolithographic and RIE processes, using $Cl_2$ as an etchant, are used to create interconnect metallization structure, 18, shown schematically in FIG. 9. The aluminum interconnect structure, 18, unlike counterpart, 12, previously shown in FIG. 4, does not exhibit thinning or poor conformality. This is due to aluminum deposition being performed on a less severe topology, without excessive tungsten seams or voids, as was the case previously described in FIG. 4. Thus the risk of yield or electromigration problems is greatly reduced. Photoresist removal is once again performed via oxygen plasma ashing, followed by careful wet cleans.

This process, although shown for tungsten fills, used to fill contact holes which connect an overlying interconnect metallization structure to an underlying active silicon device region, can also be applied for tungsten filling of via holes, used to connect two levels of interconnect metallizations. In addition this process although shown as an application for an N channel, (NFET), device, can also be applied to P channel, (PFET), devices, complimentary (CMOS), devices, as well as to BiCMOS devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device, on a semiconductor substrate, using a metal layer, between about 3000 and 6000 Angstroms in thickness, for filling contact holes, with a diameter between about 0.3 and 0.5 uM, and deposited using a deposition rate between about 3500 and 4500 Angstroms/min., to provide contact between an underlying conductive region, on said semiconductor substrate, and an overlying interconnect metallization structure, comprising the steps of:

providing said underlying conductive region, on said semiconductor substrate;

deposition of an insulator layer on said semiconductor substrate, including deposition on said underlying conductive region;

photolithographic processing to open a region in a photoresist layer, to expose said insulator layer, directly overlying a specific area of said underlying conductive region;

anisotropic etching of said insulator layer, in opened region of said photoresist layer, to create a said contact hole, with a diameter between about 0.3 and 0.5 uM, to said specific area of said underlying conductive region;

removal of said photoresist layer;

surface cleaning of said specific area, of said underlying conductive region;

deposition of an adhesive layer on top surface of said insulator layer, on sides of said contact hole, with a diameter between about 0.3 and 0.5 um, and on said specific area, of said underlying conductive region;

deposition of a barrier layer on said adhesive layer;

deposition of said metal layer, between about 3000 and 6000 Angstroms in thickness, on said barrier layer, filling said contact hole, with a diameter between about 0.3 and 0.5 uM, via low pressure chemical vapor deposition processing, using a deposition temperature between about 300° and 600° C., and a deposition rate between about 3500 and 4500 Angstroms/min where said metal layers's tungsten;

removal of said metal layer from top surface of said barrier layer, forming a metal plug in said contact hole, with a diameter between about 0.3 and 0.5 uM;

removal of said barrier layer, and of said adhesive layer, from top surface of said insulator layer;

deposition of an interconnect metallization layer on top surface of said insulator layer, and on top surface of said metal plug, in said contact hole, with a diameter between about 0.3 and 0.5 uM; and patterning of said interconnect metallization layer, to form metal interconnect structure.

2. The method of claim 1, wherein said underlying conductive region, on said semiconductor substrate, is an N type, doped source and drain region, of a MOSFET device.

3. The method of claim 1, wherein said underlying conductive region, on said semiconductor substrate, is a metal interconnect structure.

4. The method of claim 1, wherein said insulator layer is silicon oxide, deposited using either LPCVD, PECVD, or APCVD processing, at a temperature between about 300° and 800° C., to a thickness between about 5000 and 10000 Angstroms.

5. The method of claim 1, wherein said contact hole, with a diameter between about 0.3 and 0.5 uM, is formed via anisotropic, RIE processing, using $CHF_3$ as an etchant, resulting in an aspect ratio between about 1 and 3.

6. The method of claim 1, wherein said adhesive layer is titanium, deposited using r.f. sputtering, to a thickness between about 200 and 500 Angstroms.

7. The method of claim 1, wherein said barrier layer is titanium nitride, deposited using r.f. sputtering, to a thickness between about 50 and 1000 Angstroms.

8. The method of claim 1, wherein said metal layer, between about 3000 and 6000 Angstroms in thickness is tungsten, deposited using LPCVD processing, via decomposition of tungsten hexafluoride, at a temperature between about 300° and 600° C., at a deposition rate between about 3500 and 4500 Angstroms/min.

9. The method of claim 1, wherein said metal layer, between about 3000 and 6000 Angstroms in thickness, from top surface of said barrier layer, is removed via RIE processing, using $SF_6$ and $Cl_2$, or $Cl_2$, as an etchant.

10. The method of claim 1, wherein removal of said barrier layer, and of said adhesive layer, from top surface of said insulator layer, is performed via RIE processing, using $BCl_3$ and $Cl_2$ as an etchant.

11. The method of claim 1, wherein said interconnect metallization layer is aluminum, containing between about 0.5 and 2.0% copper, and between about 0.5 and 3.0% silicon, deposited using r.f. sputtering, to a thickness between about 3000 and 8000 Angstroms.

12. A method for fabricating a MOSFET device, on a semiconductor substrate, using a layer of tungsten, between about 3000 and 6000 Angstroms in thickness, deposited using LPCVD processing, using a low deposition temperature, and a deposition rate between about 3500 and 4500 Angstroms/min., to fill contact holes, with a diameter between about 0.3 and 0.5 uM, to provide contact between an underlying conductive region, on said semiconductor substrate, and an overlying interconnect metallization structure, comprising the steps of:

providing said underlying conductive region, on said semiconductor substrate;

deposition of an insulator layer on said semiconductor substrate, including deposition on said underlying conductive region;

photolithographic processing to open a region in a photoresist layer, to expose said insulator layer, directly overlying a specific area of said underlying conductive region;

anisotropic etching of said insulator layer, in opened region of said photoresist layer, to create a contact hole, with a diameter between about 0.3 and 0.5 uM, to said specific area of said underlying conductive region;

removal of said photoresist layer;

surface cleaning of said specific area, of said underlying conductive region;

deposition of a titanium layer on top surface of said insulator layer, on sides of said contact hole, with a diameter between about 0.3 and 0.5 uM, and on said specific area, of said underlying conductive region;

deposition of a titanium nitride layer on said titanium layer;

low pressure chemical vapor deposition of a said tungsten layer, between about 3000 and 6000 Angstroms in thickness, on said titanium nitride layer, filling said contact hole, with a diameter between about 0.3 and 0.5 uM, using a deposition temperature between about 300° and 600° C., and a deposition rate between about 3500 and 4500 Angstroms/min.;

removal of said thin tungsten layer from top surface of said titanium nitride layer, forming a tungsten plug in said contact hole, with a diameter between about 0.3 and 0.5 uM,;

removal of said titanium nitride layer, and of said titanium layer, from top surface of said insulator layer;

deposition of an interconnect metallization layer on top surface of said insulator layer, and on top surface of said tungsten plug, in said contact hole, with a diameter between about 0.3 and 0.5 uM; and patterning of said interconnect metallization layer, to form metal interconnect structure.

13. The method of claim 12, wherein said underlying conductive region, on said semiconductor substrate, is an N type, doped, source and drain region, of a MOSFET device.

14. The method of claim 12, wherein said underlying conductive region, on said semiconductor substrate, is a metal interconnect structure.

15. The method of claim 12, wherein said insulator layer is silicon oxide, deposited using either LPCVD, PECVD, or APCVD processing, at a temperature between about 300° and 800° C., to a thickness between about 5000 and 10000 Angstroms.

16. The method of claim 12, wherein said contact hole, with a diameter between about 0.3 and 0.5 uM, is formed via anisotropic RIE processing, using $CHF_3$ as an etchant, resulting in an aspect ratio between about 1 and 3.

17. The method of claim 12, wherein said titanium layer is deposited using r.f. sputtering, to a thickness between about 200 and 500 Angstroms.

18. The method of claim 12, wherein said titanium nitride layer is deposited using r.f. sputtering, to a thickness between about 50 and 1000 Angstroms.

19. The method of claim 12, wherein said tungsten layer, between about 3000 and 6000 Angstroms in thickness, is deposited using LPCVD processing, via decomposition of tungsten hexafluoride, at a temperature between about 300° and 600° C., with a deposition rate between about 3500 and 4500 Angstroms/min.

20. The method of claim 12, wherein said tungsten layer, with a thickness between about 3000 and 6000 Angstroms in thickness, is removed from top surface of said titanium nitride layer, via RIE processing, using $SF_6$ and $Cl_2$, or $Cl_2$, as an etchant.

21. The method of claim 12, wherein removal of said titanium nitride layer, and of said titanium layer, from top surface of said insulator layer, is accomplished via RIE processing, using $BCl_3$ and $Cl_2$ as an etchant.

22. The method of claim 12, wherein said interconnect metallization layer is aluminum, containing between about 0.5 and 2.0% copper, and between about 0.5 and 3.0% silicon, deposited using r.f. sputtering, to a thickness between about 3000 and 8000 Angstroms.

* * * * *